(12) United States Patent
Jakobsen

(10) Patent No.: US 7,023,083 B2
(45) Date of Patent: Apr. 4, 2006

(54) MULTI-LAYER DEVICE AND METHOD FOR PRODUCING THE SAME

(75) Inventor: Henrik Jakobsen, Horten (NO)

(73) Assignee: Sensonor ASA, Horten (NO)

( * ) Notice: Subject to any disclaimer, the term of this patent is extended or adjusted under 35 U.S.C. 154(b) by 30 days.

(21) Appl. No.: 10/799,760

(22) Filed: Mar. 15, 2004

(65) Prior Publication Data
US 2004/0183189 A1   Sep. 23, 2004

(30) Foreign Application Priority Data
Mar. 18, 2003   (EP)   ................... 03251626

(51) Int. Cl.
H01L 23/10   (2006.01)
(52) U.S. Cl. ............... 257/710; 257/659; 257/660; 257/704; 438/108; 438/109
(58) Field of Classification Search ............... 257/659, 257/660, 704; 438/108, 109
See application file for complete search history.

(56) References Cited

U.S. PATENT DOCUMENTS

| 4,291,293 | A |  | 9/1981 | Yamada et al. |
| 4,773,972 | A |  | 9/1988 | Mikkor |
| 6,566,170 | B1 |  | 5/2003 | Marion et al. |
| 6,806,557 | B1 | * | 10/2004 | Ding ........................ 257/659 |

FOREIGN PATENT DOCUMENTS

| EP | 0 962 275 A2 | 12/1999 |
| FR | 2 780 200 | 12/1999 |
| WO | WO 01/56921 A2 | 8/2001 |

OTHER PUBLICATIONS

Daniel Lapadatu et al.; "Building of Silicon Mechanical Sensors by Bulk Micromachining and Anodic Bonding"; 1998 International Semiconductor Conference, Sinaia, Romania Oct. 6-10, 1998; IEEE, vol. 1; pp. 33-44.
A.V. Chavan et al.; "A Monolithic fully-Integrated Vacuum-Sealed CMOS Pressure Sensor"; Proceedings of the IEEE 13th Annual International Conference; Miyazaki, Japan, Jan. 23-27, 2000; IEEE, Jan. 23, 2000; pp. 341-346.

* cited by examiner

*Primary Examiner*—Mai-Huong Tran
(74) *Attorney, Agent, or Firm*—Edell, Shapiro & Finnan, LLC

(57) ABSTRACT

A method for producing a multi-layer device. The method initially providing a substrate which comprises a support region for supporting an electrical component, then forming an electrically conductive bond layer on a surface of the substrate. The bond is configured to surround the region for supporting the component. The next step in the method is to provide an encasing layer in contact with the bond layer, such that the component is encased between the substrate and the encasing layer. The final step involves bonding the encasing layer to the bond layer to form a sealed cavity which encloses the component.

Further, a multi-layer device is provided. The device comprises a substrate, at least one electrical component which is located on the substrate, an electrically conductive bond layer and an encasing layer. The bond layer is formed on the substrate and surrounds the electrical components and the encasing layer is bonded to the bond layer to form a sealed cavity encasing the components therein.

10 Claims, 4 Drawing Sheets

MULTI-LAYER DEVICE AND METHOD FOR PRODUCING THE SAME

FILED OF THE INVENTION

This invention relates to the field of wafer scale packaging techniques. In particular solutions suitable for packaging of a monolithically integrated system. The monolithically integrated system may be a passive microstructure, microsensor, microactuator, an interconnect substrate for a microsystem and/or a complete microsystem that includes a dedicated complementary metal oxide semiconductor (CMOS) or BiCMOS interface circuit realised on the same wafer.

BACKGROUND

Micro electromechanical systems (MEMS), both sensors and actuators, are becoming increasingly important. Sensors like silicon pressure sensors, silicon, accelerometers and silicon flow sensors are elements of important industrial production. Within the area of actuators, ink jet nozzles, fuel injection nozzles and micropumps built from single crystal silicon are now available. More products are currently under development and are being introduced, including complete microsystems with sensors, actuators and electronics on the same silicon chip. An overview of methods for micromachining of three-dimensional structures in silicon is given in a textbook written by M. Madou "Fundamentals of Microfabrication", CRC Press, 1997.

In order to produce Microsystems such as sensors and actuators at low cost it is necessary to be able to package such systems effectively. Various packaging techniques are currently known in the art, but many of them lack reliability and may not achieve a quality seal during the bonding process. Indeed, where appropriate quality is found in packaging systems of the prior art it is associated with increased complexity which, in turn, causes these manufacturing techniques to be expensive.

One such technique uses anodic bonding. However, anodic bonding of sodium borosilicate glass encasing wafers and CMOS or BiCMOS wafers is known to result in problems related to the large electric fields present during the bonding process. In addition, there are problems with this particular example regarding sodium contamination as a result of the bonding process.

Furthermore, on highly pre-processed silicon wafers, uncovered silicon is normally not available for anodic bonding due to issues like contamination control, circuit integrity and limitations with respect to the implementation of electrical feedthroughs. Anodic bonding may, therefore, have to be performed to other materials than the bulk silicon.

Anodic bonding of glass to a thin poly-silicon film is presented by K. Yamada et. al. In U.S. Pat. No. 4,291,293. A passivation layer is present between the single crystal silicon surface and the thin poly-silicon film in the sealing area. However, there are certain limitations to this technique.

One technological problem with anodic bonding to a poly-silicon surface is the difficulty of avoiding diffusion of mobile ions from the glass along grain boundaries in the poly-silicon film into the passivating film at the bonding temperature. Sodium contamination may cause electrical instability and reliability problems. Ionic contamination in the passivation over PN-junctions may not only lead to reduction in break-down voltages and cause leakage currents, but may also cause N-type inversion layers to be formed on lightly doped P-type areas between doped N-areas that should be insulated from each other. Such effects are well known.

A second technological problem with anodic bonding to a poly-silicon surface is the high surface roughness of the poly-silicon film. Attempts have been made to overcome the problems related to surface roughness by the use of chemical mechanical polishing (CMP) of the poly-silicon surface before bonding as demonstrated by A. V. Chavan and K. D. Wise: "A monolithic fully-integrated vacuum-sealed CMOS pressure sensor", Proceedings of the IEEE Thirteenth Annual International Conference on Micro Electro Mechanical Systems, 2000, pp 341–346. However, such techniques merely further increase the complexity of the manufacturing process.

It is necessary to maintain an electrical conduction path between the system being packaged and an external contact. One method for providing such an electrical conduction path through anodically bonded and hermetically sealed areas is described in EP-A-0742581 where such conducting feed throughs are provided by the use of doped buried crossings in the single crystal silicon wafer. However, there are problems associated with this method, such as the attainable sheet resistance of the buried conductors, the stray capacitance related to the depletion region surrounding the buried conductors, the polarity and temperature limitations of using PN-junction isolation and the incompatibility with some CMOS and BiCMOS processes. This means that the process cannot be used for all types of device and has limitation.

SUMMARY

The present invention seeks to overcome the aforementioned problems, by providing an alternative means which enables effective bonding to be performed in a consistent and reliable manner to achieve a good quality seal without the use of complex and costly additional manufacturing steps.

According to the present invention there is provided a method for producing a multi-layer device, the method comprising the steps of:

providing a substrate comprising a support region for supporting an electrical component in use;

forming an electrically conductive bond layer on a surface of the substrate, the bond surrounding the support region;

providing an encasing layer in contact with the bond layer, to encase the component between the substrate and the encasing layer, and bonding the encasing layer to the bond layer to form a sealed cavity enclosing the component.

According to the present invention there is further provided a multi-layer device comprising:

a substrate;

at least one electrical component located on the substrate;

an electrically conductive bond layer, formed on the substrate and surrounding the electrical components; and an encasing layer, wherein the encasing layer is bonded to the bond layer to form a sealed cavity encasing the components therein.

The substrate may comprise an electrical conductor which may be positioned in isolation from the bond layer, this electrical conductor connects the internal components with an external contact pad. This conductor may be formed from at least one conducting layer coupled with conducting plugs and surrounded by dielectric layers to isolate the conductor from the substrate surface.

The component may be CMOS or BiCMOS circuitry, alternatively it may be a micro-sensor or a micro-actuator.

An electrical shield may be provided in order to avoid the build up of electrical potential differences and charges over any part of the component, which may, in turn, be detrimental to the internal component of the device. The shield must cover the parts of the component that are to be protected, and can be electrically connected to the substrate during the bonding process.

A further encasing layer may be bonded directly to another surface of the substrate or by using a second electrically conductive bond layer in order to form a second sealed cavity in the device.

Multiple devices may be produced simultaneously on the same substrate. In so doing, numerous individual bond members may be formed on the substrate, each bond member surrounding a respective component. These bond members may be inter-connected by conducting links, such that an electrical contact path is provided throughout the bond layer.

Implementation of the present invention leads to the production of improved reliability and quality of hermetically sealed devices. It also enables protection of the delicate internal system components of such devices from large electrical fields generated during the bonding process, by enabling the provision of a shielding cage. Additional benefits are achieved in that the invention does not lead to an increase in the complexity or cost of manufacture. The present invention is particularly suitable for monolithically integrated systems where sensors and/or actuators such as pressure sensors, accelerometers or resonant structures constitute the internal component. Here the component may be packaged in a controlled atmosphere with a hermetic seal. The method may be used to build micro packages at chip level, for delicate structures that need special attention, in addition to those at wafer scale.

BRIEF DESCRIPTION OF THE DRAWINGS

One example of the present invention will now be described with reference to the accompanying drawings, in which.

DETAILED DESCRIPTION

Figure 1:
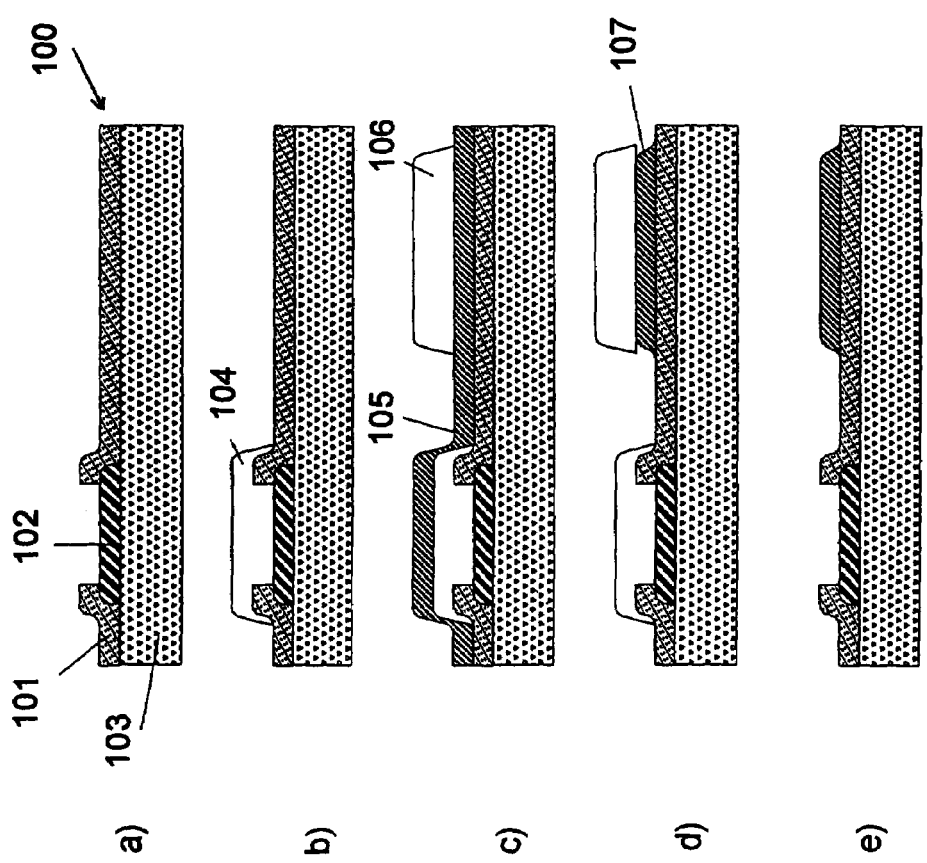
FIG. 1 illustrates a sequence for providing a pre-processed wafer with a bonding layer.

FIG. 1 shows how an electrically conductive bond layer of the present invention is formed on a pre-processed wafer 100. The sequence of FIG. 1 shows how the wafer is processed in order to prepare the wafer for packaging to a glass wafer on wafer scale by the use of anodic bonding.

A cross sectional view of a pre-processed silicon wafer 100 is shown in FIG. 1a). A passivation layer 101 may consist of an initial layer of phosphorous silica glass (PSG) followed by a layer of silicon nitride (SiN), but other layer combinations are possible. The post processing may include patterning the layers in the passivation layer independently or simultaneously. The factors governing this process will be cost and technological issues like contamination control and ease or feasibility of post processing. A primary function of the passivation layer is to prevent sodium contamination of underlying electrical circuits. An aluminium contact pad 102 is shown, but underlying conducting and dielectric layers are not included, to enhance the clarity of the figure. The passivation layer 101 and the contact pad 102 are formed on substrate 103.

The first process steps to be performed on the wafer 100, as shown in FIG. 1b), are deposition of a first layer of positive photo resist 104 on the wafer 100 and patterning of the photo resist using conventional photolithography techniques. The intention of this first layer of photo resist 104 is to protect the aluminium contact pad 102 during later processing steps.

A metal bonding layer 105 may then be deposited across the entire wafer 100. The thickness of the metal bonding layer 105 will depend on the selected type of metal and the deposition method for that metal. The metal layer must thus be of satisfactory thickness for transport of bonding current during anodic bonding. However, in order to optimise the bond strength, the metal layer 105 must have a low surface roughness, which may limit the metal layer thickness. The metal layer is preferably, but not limited to, a layer of titanium or aluminium. A layer of positive photo resist 106 is spun on the metal bonding layer 105 and patterned using conventional photolithography techniques, see FIG. 1c). This second layer of photo resist 106 serves as: a mask during the subsequent etching of the metal bonding layer 105.

As indicated in FIG. 1d), etching of the anodic bonding metal layer 105 is preferably performed with an etching process that is selective so that it does not attack the passivation layer 101. Anodic bond frames 107 and conductor lines 122 required for anodic bonding are patterned in this etching step.

The photo resist layers 104, 106 are then stripped. The resist layers used in the first 104 and the second 106 photolithography processes are not necessarily of the same material. Both photo resist layers are preferably removed in resist solvents such as acetone. Parts of the photo resist used in the first photolithography process may have to be removed in a plasma asher as well as or as an alternative to using resist solvents. Finally, descuming may be employed to remove thin film residue.

After removal of all resist layers, the wafer 100 is prepared for anodic bonding to a glass wafer or to a silicon wafer which is covered with a thin glass film, see FIG. 1e).

An alternative process sequence for patterning of the anodic bonding metal to that presented in FIG. 1 is a lift-off process. By using negative photo-resist, an edge with an overhanging profile may be achieved. When metal is deposited over such an overhanging profile, a lift-off process can be performed directly after the metal deposition if a sufficient gap is created between the metal to be lifted off and the remaining metal. If an overhanging profile cannot be achieved for the photo resist, and a sufficient gap is not created, a further photolithography process can assure that a gap is formed.

Figure 2:
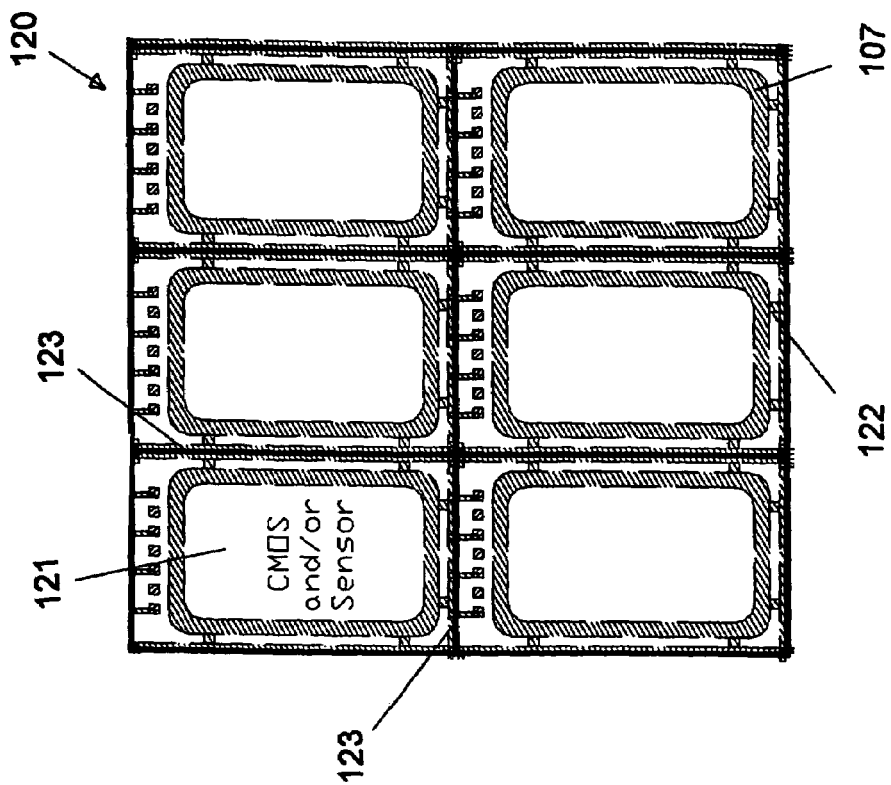
FIG. 2 illustrates how the present invention may be used to produce multiple devices on one substrate simultaneously.

Multiple devices may be formed simultaneously from a single substrate, as illustrated in FIG. 2. A continuous metal grid 120 with bond frames 107 for anodic bonding, is formed on the substrate 103 in the bonding layer 105. One metal bond frame 107 surrounds every system 121 to be packaged, and the bond frames are interconnected with metal lines 122. The linking metal lines 122 may be cut off during subsequent dicing in the scribe line 123. Several linking metal lines 122 exist for every bond frame 107 in order to assure electric contact during anodic bonding. The dimensions of the lines in the metal grid 120 are constructed with regard to the expected amount of current running through the metal grid during the bonding process.

An alternative to the principle for the layout presented in FIG. 2 is to cover the entire surface with metal, except for those areas which are not to be connected together. The option of drawing metal lines over the scribe lines is present also for this layout principle, it is preferable, however, to keep the scribe lines 123 largely free of metal.

Figure 3:
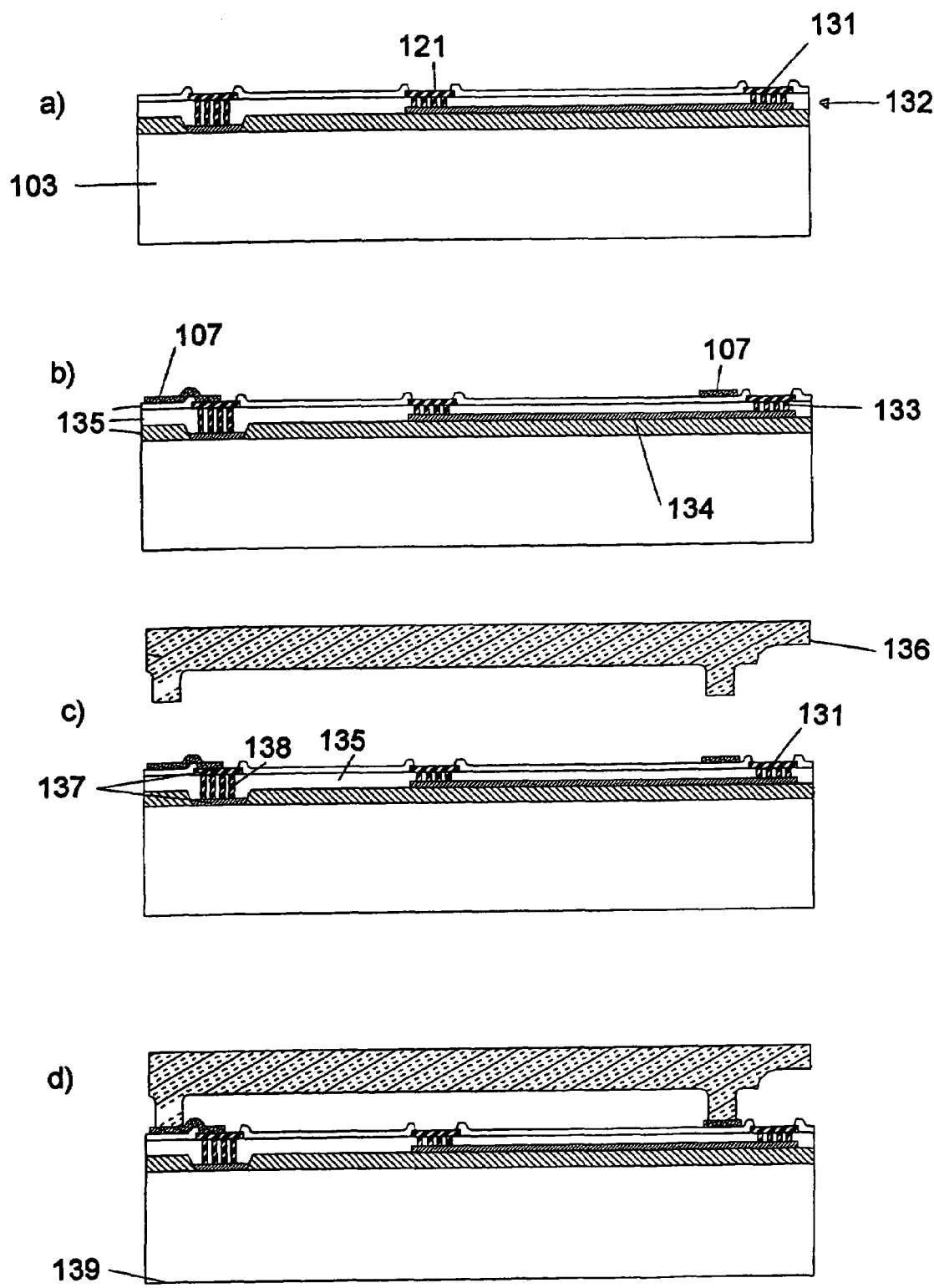
FIG. 3 illustrates a sequence for providing a sealed cavity device according to the present invention.

The system 121 to be packaged is positioned inside a bond frame 107 as illustrated in FIG. 3. An electrical contact pad 131 is positioned outside the bond frame 107 for electrical contact to external connections. An electrical feed through 132 connecting the outside contact pad 131 and the inside system 121 is illustrated. The electrical feed through 132 crossing under the bond frame 107 is composed of connected metal plugs 133 and metal lines 134 patterned during preprocessing of the wafer 100. In this example, the electrical connection 132 is made in metal, hence a low series resistance is achieved. The electrical connection 132 is insulated by layers of dielectric material 135. The thickness of the dielectric layers 135 is process dependent, but typically the layers are 2–3 µm thick. Thick dielectric layers yield low values of stray capacitance.

A glass wafer 136 with a polished surface is patterned using a hard or soft mask and wet etching. Cavities are etched in the glass wafer if required for the specific system 121 to be packaged. The glass wafer 136 is ready for anodic bonding after removal of the hard or soft mask. As an alternative to wet etching, the glass can be structured by dry etching, laser drilling or sand blasting. For some types of sensors, a metal layer is required on the glass wafer. Metal layers can be deposited and patterned on the structured or unstructured glass wafer prior to anodic bonding.

The substrate 103 and the glass wafer 136 can be anodically bonded and packaged on wafer scale. Electrical contact during anodic bonding to the metal bonding frames 107 patterned in the anodic bonding metal layer 105 on top of the pre-processed substrate 100 can be realised in several arrangements.

In one arrangement, not shown, the anodic bonding metal grid with bonding frames 107 is contacted electrically on the rim of the metal grid directly. A small portion of the glass wafer 136 must be diced off in order to realise this arrangement easily. The glass wafer 136 is assumed to originally have the same diameter and shape as the substrate 103. The metal grid may or may not be electrically isolated from the substrate during anodic bonding.

In an alternative arrangement, illustrated in FIG. 3, the anodic bonding metal grid may be contacted indirectly during anodic bonding by having an electric conduction path between the anodic bonding metal and the substrate, see FIGS. 3a) and 3b). The conduction path runs along metal lines 137 and metal plugs 138 down through dielectric layers 135 between the anodic bonding metal layer 105 and the substrate 103, as shown in FIG. 3c). The substrate is contacted on its backside 139 during anodic bonding, see FIG. 3d).

One or more conduction paths from the anodic bonding metal layer 105 to the substrate 103 may be present for every system 121 to be packaged. At least one conduction path will be present per system if a step and repeat photolithography system is used. If a proximity aligner is used for the photolithography processes, electric contacts down to the substrate may be positioned only one place on the wafer since the metal grid is supposed to be continuous. However, a certain number of conduction paths positioned evenly spread out on the wafer 100 is recommended in order to reduce the risk of broken electric contact between the metal grid 120 and the substrate 103. Space can be saved if a conduction path is not required for every system 121 to be packaged.

A further glass wafer (not shown) may be anodically bonded to the backside of the substrate 139 additionally or alternatively to the glass wafer 136 bonded to the front side of the substrate. This glass wafer may be anodically bonded directly to the silicon surface on the backside 139 of the substrate. Electrical contact to the substrate for anodic bonding to the backside can be performed directly if a glass wafer 136 is not already bonded to the front side of the substrate. Electrical contact between the anodic bonding metal 107 and the substrate 103 is, however, required. If electrical contact can not be made directly to the substrate due to the presence of a glass wafer, a piece of one of the glass wafers, initially assumed to have equal size and shape to the silicon wafer, can be removed. A piece of one of the glass wafers can be removed before anodic bonding by dicing. Probing the substrate for electrical contact during anodic bonding can then be performed where glass has been removed.

The harsh environment generated during the anodic bonding process is detrimental to the internal components 121 of the device. The present invention presents three methods for shielding the electronics from electric fields produced during anodic bonding which may be implemented without introducing additional process steps.

Figure 4:
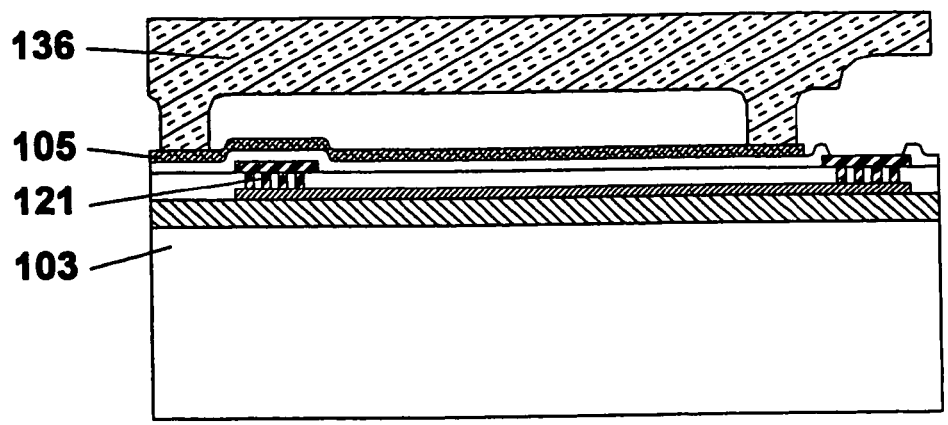
FIG. 4 illustrates how the present invention may be used to shield the electronics by patterning a metal layer, which covers the electronics, on the substrate.
Figure 5:
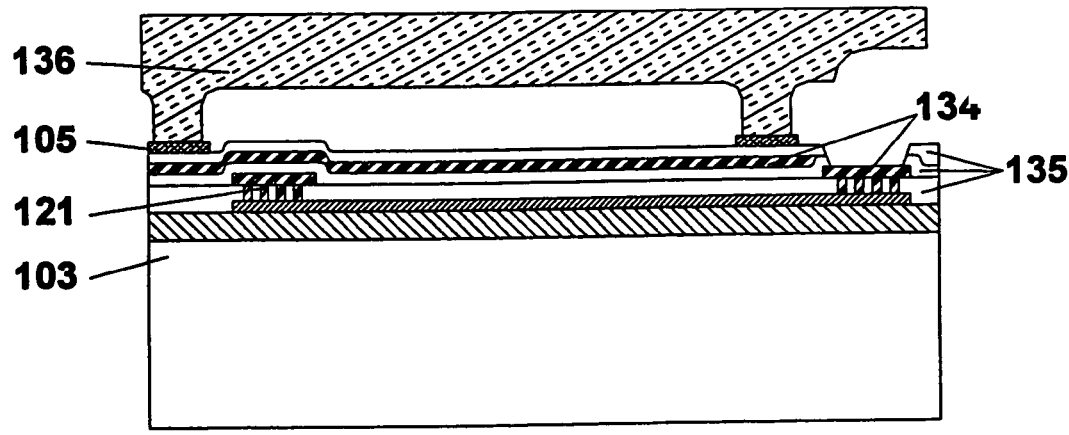
FIG. 5 illustrates how a metal layer of a CMOS or BiCMOS process may be used as a shielding layer.

Two of these methods are based on patterning a metal layer on the substrate 103. One method is patterning the anodic bonding metal layer 105 so that it covers the electronics 121, as shown in FIG. 4. The anodic bonding metal layer should then be electrically connected to the silicon substrate 103 so that the electronics will not be exposed to large electric fields during anodic bonding. The second method is to use one of the metal layers 134 of a CMOS or BiCMOS process as a shielding layer, as shown in FIG. 5. The shielding layer should be patterned so that it covers the electronics 121. Electrical connection between the shielding metal layer and the silicon substrate 103 may be formed during standard CMOS or BiCMOS processing. The fill factor of the shielding layer must be high enough for an efficient shielding cage to be formed around the electronics.

Figure 6:
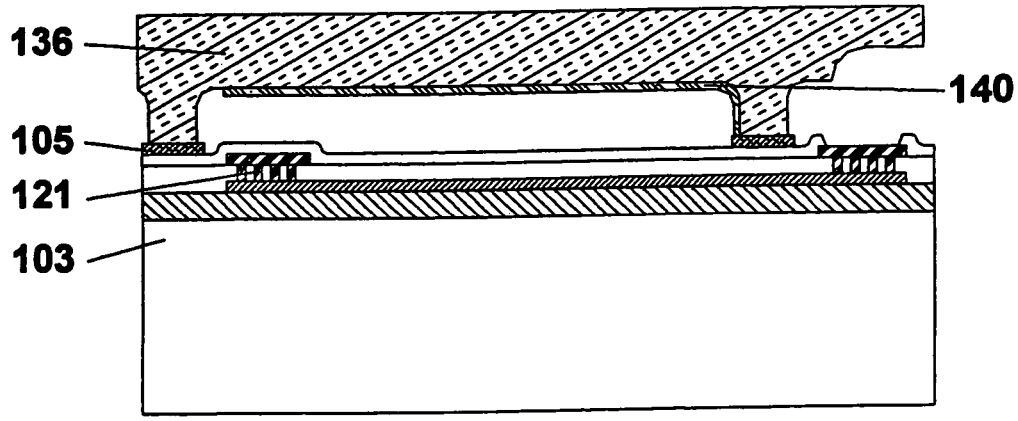
FIG. 6 illustrates how the present invention may be used to shield the electronics by patterning a metal layer on the glass wafer.

The third method is to apply and pattern a metal layer 140 on the glass wafer 136, as shown in FIG. 6. The metal should cover the electronics 121 and be electrically connected to the silicon substrate 103. Whenever electric contact between metal lines on the glass wafer 136 and metal lines on the substrate 103 is required, press contacts can be used. Press contacts can be realised with the present technology by letting metal lines running on the glass wafer 136 and the substrate 103 overlap in a certain region during anodic bonding. The overall thickness of the crossing metal lines should be slightly larger than the air gap that is closed during anodic bonding. The metal lines are thus squeezed together during anodic bonding. A low contact resistance is achievable when the squeezing results in the removal of native oxide layers on the metal lines, and intimate contact between the metal lines is obtained.

Figure 7:
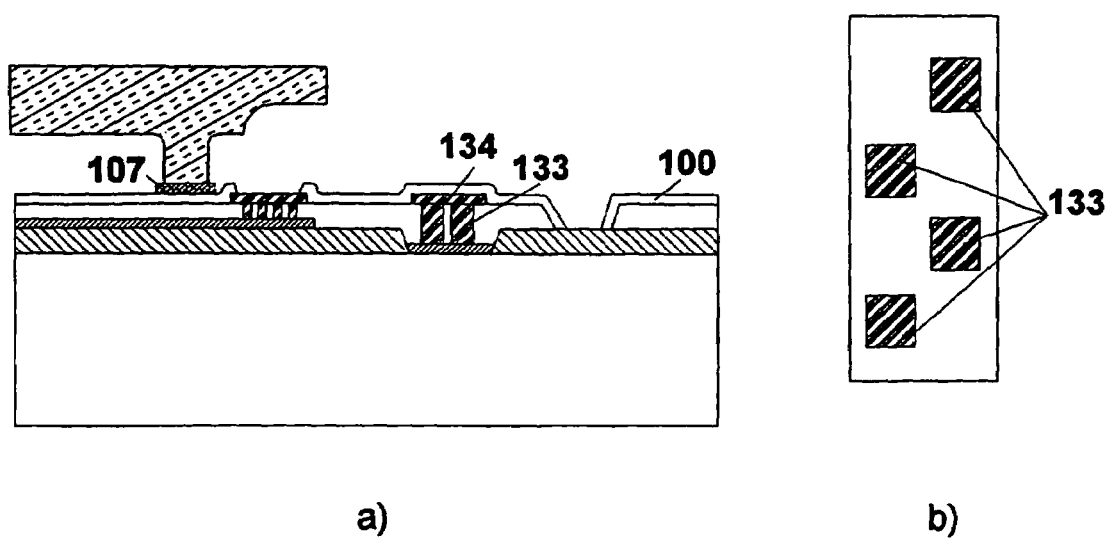
FIG. 7 illustrates how additional protection can be provided by implementing shields.

FIG. 7a) shows how additional protection can be provided by the present invention by implementing shields. Outside the bond frame 107 on each packaged system 121 there can be a metal guard ring (not shown). The purpose of a metal guard ring is to protect the packaged system 121 inside the guard ring from contamination, including ionic contamination. The metal guard ring can be formed from regions in the metal layers 134 and electrical shields 133. The shields do not have to form a continuous ring, but rather two rows of offset pillars, as illustrated in FIG. 7b). The metal shield can be anchored to the silicon, and can run vertically up through the dielectric and metal layers. On top, the guard ring can be covered by the passivation layer 100.

Outside the guard ring on each packaged system there can be an etched trench. The purpose of this etched trench is to hinder cracking and delamination of the packaged system during dicing.

The invention claimed is:

1. A multi-layer device comprising:
   a substrate;
   at least one electrical component located on the substrate;
   an electrically conductive bond layer, formed on the substrate and surrounding the electrical component; and
   an encasing layer, wherein the encasing layer is bonded to the bond layer to form a sealed cavity encasing the electrical component therein.

2. A device according to claim 1, wherein the encasing layer is anodically bonded to the bond layer to form the sealed cavity.

3. A device according to claim 1, wherein the substrate comprises an electrical conductor, positioned in isolation from the surface provided to receive the bond layer, to connect the component with an external contact pad.

4. A device according to claim 3, wherein the conductor is formed from at least one conducting layer coupled with conducting plugs.

5. A device according to claim 4, wherein the conducting layer is surrounded by dielectric layers.

6. A device according to claim 1, wherein the component is CMOS or BiCMOS circuitry.

7. A device according to claim 1, wherein the component is a pressure sensor or an inertial sensor.

8. A device according to claim 1, further comprising a conductive shielding layer which is placed on the glass wafer and connected to the substrate, in order to protect the device from the electric field generated during anodic bonding.

9. A device according to claim 1, wherein a second encasing layer is bonded to a second surface of the substrate to form a second sealed cavity.

10. A multi-layer device comprising:
    a substrate including a support region;
    at least one electrical component located within the support region;
    an electrically conductive layer surrounding the support region; and
    an encasing layer including a cavity,
    wherein the electrically conductive layer is configured to bond the encasing layer to the substrate such that the at least one electrical component is sealed within the cavity.

* * * * *

UNITED STATES PATENT AND TRADEMARK OFFICE
CERTIFICATE OF CORRECTION

PATENT NO. : 7,023,083 B2
APPLICATION NO. : 10/799760
DATED : April 4, 2006
INVENTOR(S) : Jakobsen It is certified that error appears in the above-identified patent and that said Letters Patent is hereby corrected as shown below:

TITLE PAGE, ITEM (73) SHOULD READ:

Infineon Technologies Sensonor AS, Horten (NO)

Signed and Sealed this

Twenty-second Day of May, 2007

JON W. DUDAS
*Director of the United States Patent and Trademark Office*